(12) United States Patent
An et al.

(10) Patent No.: US 12,464,941 B2
(45) Date of Patent: Nov. 4, 2025

(54) FLEXIBLE DISPLAY APPARATUS AND METHOD OF MANUFACTURING THE SAME

(71) Applicant: SAMSUNG DISPLAY CO., LTD., Yongin-si (KR)

(72) Inventors: Sung-Guk An, Yongin-si (KR); Jun Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 191 days.

(21) Appl. No.: 17/590,611

(22) Filed: Feb. 1, 2022

(65) Prior Publication Data

US 2022/0158121 A1 May 19, 2022

Related U.S. Application Data

(62) Division of application No. 14/571,114, filed on Dec. 15, 2014, now Pat. No. 11,283,055.

(30) Foreign Application Priority Data

Apr. 29, 2014 (KR) ........................ 10-2014-0051904

(51) Int. Cl.
*H10K 77/10* (2023.01)
*H10K 50/87* (2023.01)
(Continued)

(52) U.S. Cl.
CPC ........... *H10K 77/111* (2023.02); *H10K 50/87* (2023.02); *H10K 59/8794* (2023.02);
(Continued)

(58) Field of Classification Search
CPC ............... H01L 51/0097; H01L 51/529; H01L 51/5253; H01L 51/5256; H01L 2251/5338;
(Continued)

(56) References Cited

U.S. PATENT DOCUMENTS 8,337,800 B2 12/2012 Nishikawa et al.
8,574,662 B2 11/2013 Lee
(Continued)

FOREIGN PATENT DOCUMENTS

JP 4303591 B2 7/2009
JP 2010-153813 A 7/2010
(Continued)

OTHER PUBLICATIONS

Korean Decision on Registration issued in Application No. KR 10-2014-0051904, dated Nov. 29, 2021, 2 pages.

*Primary Examiner* — Sue A Purvis
*Assistant Examiner* — Aneta B Cieslewicz
(74) *Attorney, Agent, or Firm* — Womble Bond Dickinson (US) LLP

(57) ABSTRACT

A flexible display apparatus includes: a first flexible substrate including carbon and having an upper surface, a lower surface facing the upper surface, and a lateral surface coupling the upper surface to the lower surface; a first barrier layer on the first flexible substrate to cover the first flexible substrate; a second flexible substrate on the first barrier layer, the second flexible substrate including carbon and having an upper surface, a lower surface facing the upper surface, and a lateral surface coupling the upper surface to the lower surface; and an organic light emitting device on the second flexible substrate.

5 Claims, 5 Drawing Sheets

(51) Int. Cl.
*H10K 59/80* (2023.01)
*H10K 102/00* (2023.01)

(52) U.S. Cl.
CPC ....... *H10K 2102/311* (2023.02); *Y02E 10/549* (2013.01); *Y02P 70/50* (2015.11)

(58) Field of Classification Search
CPC ................ H10K 77/10; H10K 77/111; H10K 2102/311; H10K 59/8794; H10K 50/87; H10K 50/844; H10K 50/8445; H10K 59/873; H10K 59/8731; Y02E 10/549
See application file for complete search history.

(56) References Cited

U.S. PATENT DOCUMENTS

| | | | |
|---|---|---|---|
| 9,540,285 | B2 | 1/2017 | Ohta et al. |
| 9,769,886 | B2 | 9/2017 | Jung et al. |
| 2002/0140347 | A1 | 10/2002 | Weaver |
| 2004/0265508 | A9 | 12/2004 | Burrows et al. |
| 2008/0014426 | A1 | 1/2008 | Nishikawa et al. |
| 2010/0320450 | A1 | 12/2010 | Fujioka |
| 2011/0033677 | A1 | 2/2011 | Shin et al. |
| 2011/0143079 | A1 | 6/2011 | Lee |
| 2011/0291544 | A1 | 12/2011 | Wei et al. |
| 2012/0146492 | A1* | 6/2012 | Ryu ................... H10K 50/8445 313/512 |
| 2012/0282419 | A1 | 11/2012 | Ahn et al. |
| 2012/0282446 | A1 | 11/2012 | Jo et al. |
| 2013/0164210 | A1* | 6/2013 | Ohta ...................... C08G 69/26 423/448 |
| 2014/0339517 | A1* | 11/2014 | Park ...................... H10K 77/111 257/40 |
| 2014/0346473 | A1* | 11/2014 | Park ...................... H10K 71/00 257/40 |

FOREIGN PATENT DOCUMENTS

| | | |
|---|---|---|
| KR | 10-0880155 B1 | 1/2009 |
| KR | 10-2010-0033866 A | 3/2010 |
| KR | 10-2011-0014446 A | 2/2011 |
| KR | 10-2011-0097743 A | 8/2011 |
| KR | 10-1075481 B1 | 10/2011 |
| KR | 10-1117726 B1 | 3/2012 |
| KR | 10-1206352 B1 | 11/2012 |
| KR | 10-2014-0011792 A | 1/2014 |
| KR | 10-2014-0043022 A | 4/2014 |
| WO | WO 00/26408 | 5/2000 |
| WO | WO 2012/026408 A1 | 3/2012 |

\* cited by examiner

FLEXIBLE DISPLAY APPARATUS AND METHOD OF MANUFACTURING THE SAME

CROSS-REFERENCE TO RELATED APPLICATIONS

This application is a divisional of U.S. patent application Ser. No. 14/571,114, filed Dec. 15, 2014, which claims priority to and the benefit of Korean Patent Application No. 10-2014-0051904, filed Apr. 29, 2014, the entire content of both of which is incorporated herein by reference.

BACKGROUND

1. Field

Aspects of embodiments of the present invention relate to a flexible display apparatus and a method of manufacturing the flexible display apparatus, and more particularly, to a flexible display apparatus having an improved heat dissipation function and a method of manufacturing the flexible display apparatus.

2. Description of the Related Art

Due to the increased interest in flexible display apparatuses, research into flexible display apparatuses is being vigorously conducted. A flexible display apparatus includes a flexible substrate formed of a material such as a synthetic resin, instead of a glass substrate according to existing display apparatuses. As the flexible substrate is flexible, it is difficult to handle the flexible substrate in a manufacturing process. Thus, a flexible substrate is formed on a support substrate having enough rigidity for the manufacturing process, and after several manufacturing processes, the flexible substrate is separated from the support substrate.

However, in the flexible display apparatus and the method of manufacturing the same according to existing art, a thermal conductivity of the flexible substrate formed of a material such as a plastic is lower than that of a glass substrate, and thus, a heat dissipation sheet is additionally attached thereto.

SUMMARY

Aspects of embodiments of the present invention relate to a flexible display apparatus having an improved heat dissipation function and a method of manufacturing the flexible display apparatus.

Additional aspects will be set forth in part in the description which follows and, in part, will be apparent from the description, or may be learned by practice of the presented embodiments.

According to an embodiment of the present invention, a flexible display apparatus includes: a first flexible substrate including carbon and having an upper surface, a lower surface facing the upper surface, and a lateral surface coupling the upper surface to the lower surface; a first barrier layer on the first flexible substrate to cover the first flexible substrate; a second flexible substrate on the first barrier layer, the second flexible substrate including carbon and having an upper surface, a lower surface facing the upper surface, and a lateral surface coupling the upper surface to the lower surface; and an organic light emitting device on the second flexible substrate.

The first barrier layer may cover the upper surface and the lateral surface of the first flexible substrate.

The flexible display apparatus may further include a second barrier layer on the second flexible substrate to cover the second flexible substrate, and the organic light emitting device may be on the second barrier layer.

The second barrier layer may cover the upper surface and the lateral surface of the second flexible substrate.

At least a portion of the second barrier layer may cover at least a portion of the first barrier layer that covers the lateral surface of the first flexible substrate.

The first and the second barrier layers may include an inorganic material.

The first and the second flexible substrates may each include carbon at a ratio of greater than or equal to 60%.

According to another embodiment of the present invention, a method of manufacturing a flexible display apparatus includes: coating a support substrate with a first polymer layer; carbonizing or graphitizing the first polymer layer; forming a first barrier layer on the carbonized or graphitized first polymer layer; and forming an organic light emitting device on the first barrier layer.

The forming of the first barrier layer may include forming the first barrier layer to cover the carbonized or graphitized first polymer layer so that at least a portion of the first barrier layer contacts the support substrate at an outer portion of the carbonized or graphitized first polymer layer.

The method may further include: coating the first barrier layer with a second polymer layer; carbonizing or graphitizing the second polymer layer; and forming a second barrier layer on the carbonized or graphitized second polymer layer.

The forming of the organic light emitting device may include forming the organic light emitting device on the second barrier layer.

The forming of the first barrier layer and the forming of the second barrier layer may include forming the first barrier layer and the second barrier layer of an inorganic material.

The carbonizing or graphitizing of the first polymer layer may include carbonizing or graphitizing the first polymer layer at a temperature from about 300° C. to about 4000° C., and the carbonizing or graphitizing of the second polymer layer may include carbonizing or graphitizing the second polymer layer at a temperature from about 300° C. to about 4000° C.

The carbonizing or graphitizing of the first polymer layer may include carbonizing or graphitizing the first polymer layer such that a ratio of carbon included in the first polymer layer may be greater than or equal to 60%, and the carbonizing or graphitizing of the second polymer layer may include carbonizing or graphitizing the second polymer layer such that a ratio of carbon included in the second polymer layer may be greater than or equal to 60%.

The forming of the second barrier layer may include forming the second barrier layer to cover the carbonized or graphitized second polymer layer such that at least a portion of the second barrier layer contacts at least a portion of the first barrier layer at an outer portion of the carbonized or graphitized second polymer layer.

BRIEF DESCRIPTION OF THE DRAWINGS

These and other aspects will become apparent and more readily appreciated from the following description of the example embodiments, taken in conjunction with the accompanying drawings in which.

DETAILED DESCRIPTION

Figure 1:
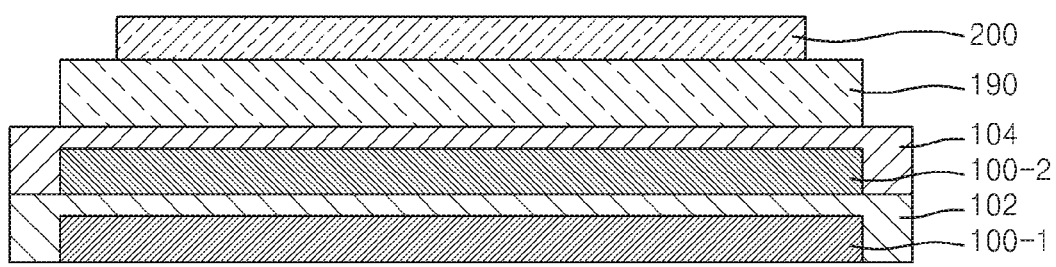
FIG. 1 is a schematic cross-sectional view illustrating a flexible display apparatus according to an embodiment of the present invention.

Reference will now be made in detail to embodiments, examples of which are illustrated in the accompanying drawings, wherein like reference numerals refer to like elements throughout. In this regard, aspects of the present invention may be embodied in various different forms and should not be construed as being limited to the example embodiments described herein. Accordingly, the embodiments are merely described below, with reference to the figures, to describe aspects of the present invention. As used herein, the term "and/or" includes any and all combinations of one or more of the associated listed items. Expressions such as "at least one of," when preceding a list of elements, modify the entire list of elements and do not modify the individual elements of the list.

Since the present invention may have various modifications and embodiments, example embodiments are shown in the drawings and will be described in detail. Aspects, features, and methods of achieving the same will be apparent with reference to the embodiments described below in detail together with the attached drawings. However, the embodiments may have different forms and should not be construed as being limited to the descriptions set forth herein.

The embodiments of the present invention will be described below in more detail with reference to the accompanying drawings. Those components that are the same or substantially the same have the same reference numeral regardless of the figure number, and redundant descriptions thereof are omitted.

It will be understood that although the terms "first", "second", etc. may be used herein to describe various components, these components should not be limited by these terms. These components are only used to distinguish one component from another. Singular expressions, unless defined otherwise in context, include plural expressions.

In the embodiments below, it will be further understood that the terms "comprise" and/or "have" used herein specify the presence of the stated features or components, but do not preclude the presence or addition of one or more other features or components. Also, it will be understood that when a portion such as a layer, an area, or an element is referred to as being "on" or "above" another portion, it can be directly on or above the other portion, or one or more intervening portions may also be present. Further, when an element is described as "coupled" or "connected" to another element, the element may be "directly coupled" or "directly connected" to the other element, or "indirectly coupled" or "indirectly connected" to the other element through one or more intervening elements.

In the drawings, for convenience of illustration, sizes of elements may be exaggerated or contracted. In other words, since sizes and thicknesses of components in the drawings are arbitrarily illustrated for convenience of illustration, the following embodiments are not limited thereto.

In the embodiments below, an x-axis, a y-axis, and a z-axis are not limited to three axes on a rectangular coordinates system, but may be construed as including these axes. For example, an x axis, a y-axis, and a z-axis may or may not be at right angles with respect to one another, and may also correspond to directions which are different from one another.

When an embodiment may be implemented in another manner, a process order may be different from the one described. For example, two processes that are described as being performed in a consecutive order may be performed at the same or substantially the same time, or may be performed in an opposite order to the described order.

Figure 2:
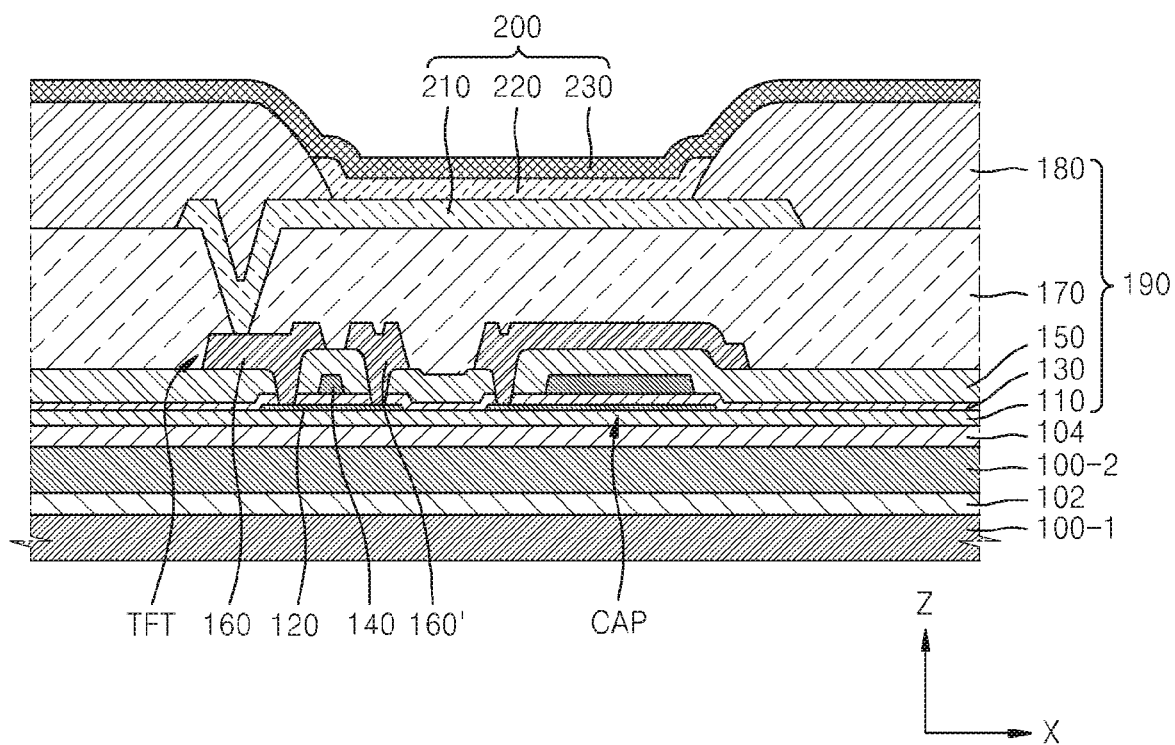
FIG. 2 is a detailed cross-sectional view illustrating a portion of a stack structure of the flexible display apparatus, according to an embodiment of the present invention.

FIG. 1 is a schematic cross-sectional view illustrating a flexible display apparatus according to an embodiment of the present invention. FIG. 2 is a detailed cross-sectional view illustrating a portion of a stack structure of the flexible display apparatus, according to an embodiment of the present invention.

Referring to FIG. 1, the flexible display apparatus includes a first flexible substrate 100-1, a first barrier layer 102, a second flexible substrate 100-2, a second barrier layer 104, and an organic light emitting device 200.

The first flexible substrate 100-1 is flexible and may have a planar shape having a predetermined thickness. In other words, the first flexible substrate 100-1 may have an upper surface, a lower surface facing the upper surface, and a lateral surface connecting the upper surface and the lower surface. The lateral surface of the first flexible substrate 100-1, which has a planar shape, may have various thicknesses, for example, from about 10 nm to about 500 μm.

The first flexible substrate 100-1 may be formed by carbonizing (e.g. graphitizing) a plastic material such as polyethylene terephthalate (PET), polyethylene naphthalate (PEN), or polyimide, or a polymer material such as polybenzoxazole (PBO), polybenzimidazole (PBI), polyoxadiazole (POD), polytriazole, or polyacylonitirile (PAN), so that the first flexible substrate 100-1 has excellent heat resistance, durability, and flexible characteristics. As used herein, in one example embodiment, carbonizing refers to the conversion of an organic substance into carbon or a carbon-containing residue. Thus, the first flexible substrate 100-1 includes carbon, and may have a ratio of carbon that is greater than or equal to about 60% (e.g., 60% or greater). As used herein, in one example embodiment, when a substrate includes carbon at a ratio (e.g., a ratio of carbon) of greater than or equal to about 60%, the total amount of carbon in the substrate constitutes 60% or more of the material contained in the substrate, and by ratio, it refers to molar ratio, in one embodiment. The first flexible substrate 100-1 may have a display area where a plurality of pixels are located, and a peripheral area that surrounds the display area.

The first barrier 102 covering the first flexible substrate 100-1 may be disposed on the first flexible substrate 100-1. The first barrier layer 102 may be formed of an inorganic layer, for example, a silicon oxide and/or a silicon nitride.

As illustrated in FIG. 1, the first barrier layer 102 may be disposed to cover the upper and lateral surfaces of the first flexible substrate 100-1. The first barrier layer 102 may allow the first flexible substrate 100-1, which includes carbon, to remain flexible. Also, in a manufacturing operation of the flexible display apparatus according to the present embodiment of the present invention, the first flexible substrate 100-1, which is formed through carbonization (e.g., graphitization), has a weak adhesive force with respect to a support substrate. In this case, at least a portion of the first barrier layer 102 may be disposed at an outer portion of the first flexible substrate 100-1, and may contact the support substrate in order to maintain adhesion between the support substrate and the first flexible substrate 100-1. Accordingly, the first barrier layer 102 may be disposed to cover not only the upper surface, but also the lateral surface of the first flexible substrate 100-1.

A second flexible substrate 100-2 may be disposed on the first barrier layer 102. The second flexible substrate 100-2 is flexible and may also have a planar shape having a predetermined thickness, like that of the first flexible substrate 100-1 described above. In other words, the second flexible substrate 100-2 may have an upper surface, a lower surface facing the upper surface, and a lateral surface connecting the upper surface and the lower surface. The lateral surface of the second flexible substrate 100-2, which has a planar shape, may have various thicknesses, for example, from about 10 nm to about 500 μm.

Like the first flexible substrate 100-1, the second flexible substrate 100-2 may be formed by carbonizing (e.g., graphitizing) a plastic material such as PET, PEN, or polyimide, or a polymer material such as PBO, PBI, POD, polytriazole, or PAN, so that the second flexible substrate 100-2 has excellent heat resistance, durability, and flexible characteristics. Accordingly, the second flexible substrate 100-2 includes carbon, and may have a ratio of carbon that is greater than or equal to about 60% (e.g., 60% or greater).

The second barrier layer 104 covering the upper and lateral surfaces of the second flexible substrate 100-2 may be disposed on the second flexible substrate 100-2. Like the first barrier layer 102, the second barrier layer 104 may be formed of an inorganic layer, for example, a silicon oxide and/or a silicon nitride.

As illustrated in FIG. 1, the second barrier layer 104 may be disposed to cover the upper and lateral surfaces of the second flexible substrate 100-2. The second barrier layer 104 may allow the second flexible substrate 100-2, which includes carbon, to remain flexible. Also, in a manufacturing operation of the flexible display apparatus according to the present embodiment of the present invention, in order for the first flexible substrate 100-1 and the second flexible substrate 100-2 to easily adhere to each other, at least a portion of the second barrier layer 104 may be disposed at an outer portion of the second flexible substrate 100-2, and may contact the first barrier layer 102. Accordingly, the second barrier layer 104 may be disposed to cover not only the upper surface, but also the lateral surface of the second flexible substrate 100-2.

A thin film transistor (TFT) layer 190 may be disposed on the second barrier layer 104. In addition to a TFT, various elements such as a capacitor or a wiring unit may be disposed in the TFT layer 190. Also, the organic light emitting device 200 may be disposed on the TFT layer 190. The organic light emitting device 200 may include a pixel electrode 210, an intermediate layer 220 including an emission layer, and an opposing electrode 230. A typical structure of the TFT layer 190 and the organic light emitting device 200 will be described with reference to FIG. 2.

As illustrated in FIG. 2 and described above, the flexible display apparatus according to the present embodiment of the present invention includes the first flexible substrate 100-1, the second flexible substrate 100-2, the first barrier layer 102 interposed between the first flexible substrate 100-1 and the second flexible substrate 100-2, the second barrier layer 104 disposed on the second flexible substrate 100-2, the TFT layer 190 disposed on the second barrier layer 104, and the organic light emitting device 200 disposed on the TFT layer 190.

The TFT disposed on the second barrier layer 104 includes a semiconductor layer 120 including amorphous silicon, polycrystalline silicon, or an organic semiconductor material, a gate electrode 140, a source electrode 160', and a drain electrode 160. Hereinafter, a typical structure of the TFT will be described in detail.

A buffer layer 110 formed of, for example, a silicon oxide or a silicon nitride, is disposed on the second flexible substrate 100-2 in order to planarize the second flexible substrate 100-2, or to prevent or substantially prevent penetration of impurities into the semiconductor layer 120. The semiconductor layer 120 may be disposed on the buffer layer 110. The buffer layer 110 may be integrally formed with the second barrier layer 104, or no buffer layer may be disposed and the second barrier layer 104 may function as a buffer layer.

The gate electrode 140 is disposed on the semiconductor layer 120, and the source electrode 160' and the drain electrode 160 are electrically operated according to a signal applied to the gate electrode 140. The gate electrode 140 may be formed of at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed as a single layer or a multilayer structure, in consideration of adhesive properties with respect to adjacent layers, surface planarity of stacked layers, and processability.

In order to insulate the semiconductor layer 120 and the gate electrode 140 from one another, a gate insulation layer 130 formed of a silicon oxide and/or a silicon nitride may be interposed between the semiconductor layer 120 and the gate electrode 140.

An interlayer insulation layer 150 may be disposed on the gate electrode 140, and may be formed of a material such as a silicon oxide or a silicon nitride. The interlayer insulation layer 150 may be formed as a single layer or a multilayer structure.

The source electrode 160' and the drain electrode 160 are disposed on the interlayer insulation layer 150. The source electrode 160' and the drain electrode 160 are electrically connected to the semiconductor layer 120 through contact holes formed in the interlayer insulation layer 150 and the gate insulation layer 130. The source electrode 160' and the drain electrode 160 may be formed of at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed as a single layer or a multilayer structure, in consideration of conductivity.

To protect the TFT having the above-described structure or to planarize an upper portion of the TFT, a protection layer 170 for covering the TFT may be disposed. The protection layer 170 may be formed of an inorganic material such as a silicon oxide, a silicon nitride, or a silicon oxynitride. Although the protection layer 170 illustrated in FIG. 2 is shown as being formed as a single layer structure, the protection layer 170 may be formed as a multilayer structure.

A planarization layer may be disposed on the second flexible substrate 100-2, to planarize an entire upper surface of the protection layer 170 that covers the TFT. In this case, like the protection layer 170, the planarization layer may also protect the TFT.

The protection layer 170 and the planarization layer may be formed of an acrylic organic material or a benzocyclobutene (BCB). As illustrated in FIG. 2, the gate insulation layer 130, the interlayer insulation layer 150, the protection layer 170, and the planarization layer may be formed over the first and second flexible substrates 100-1 and 100-2 (e.g., over the entire first and second flexible substrates).

A pixel defining layer 180 may be disposed on the TFT. The pixel defining layer 180 may be located on the protection layer 170, or on the planarization layer described above, and may have an opening. The pixel defining layer 180 defines a pixel area on the first and second flexible substrates 100-1 and 100-2.

The pixel defining layer 180 may be formed of, for example, an organic insulation layer. Examples of the organic insulation layer include an acrylic polymer such as polymethylmethacrylate (PMMA), polystyrene (PS), a polymer derivative having a phenol group, an imide-based polymer, an aryl ether polymer, an amide-based polymer, a fluorine-based polymer, a p-xylene-based polymer, a vinyl alcoholic polymer, and a mixture of these.

The organic light emitting device 200 may be disposed on the pixel defining layer 180. The organic light emitting device 200 may include the pixel electrode 210, the intermediate layer 220 including an emission layer, and the opposite electrode 230.

As illustrated in FIG. 2, the pixel electrode 210 may be disposed on the pixel defining layer 180. In this case, an opening portion that exposes at least one of the source electrode 160' and the drain electrode 160 of the TFT is in the protection layer 170, and the pixel electrode 210 may contact one of the source electrode 160' and the drain electrode 160 of the TFT so as to be electrically connected to the TFT through the opening portion.

The pixel electrode 210 may be formed of a transparent or semi-transparent electrode, or may be formed of a reflective electrode. When the pixel electrode 210 is formed of a transparent or semi-transparent electrode, the pixel electrode 210 may be formed of, for example, ITO, IZO, ZnO, $In_2O_3$, IGO or AZO. When the pixel electrode 210 is formed of a reflective electrode, the pixel electrode 210 may include a reflective layer and a layer formed of Ag, Mg, Al, Pt, Pd, Au, Ni, Nd, Ir, Cr or a compound thereof, and a layer formed of ITO, IZO, ZnO, $In_2O_3$, IGO or AZO. However, the present invention is not limited thereto, and the pixel electrode 210 may be formed of various materials, and may be formed as a single layer or a multilayer structure.

The intermediate layer 220 including an emission layer may be disposed in the pixel area defined by the pixel defining layer 180. The intermediate layer 220 of the organic light emitting device 200 includes an emission layer (EML), and may have a single or complex structure in which a hole injection layer (HIL), a hole transport layer (HTL), an electron transport layer (ETL), and an electron injection layer (EIL) are stacked in addition to the emission layer. However, the intermediate layer 220 is not limited thereto and may have other various structures.

The intermediate layer 220 may include a low-molecular organic material or a polymer organic material.

When the intermediate layer 220 includes a low-molecular organic material, a hole injection layer (HIL), a hole transport layer (HTL), the EML, an electron transport layer (ETL), and an electron injection layer (EIL) may be stacked with respect to an emission layer (EML) in the intermediate layer 220. Non-limiting examples of available organic materials may include copper phthalocyanine (CuPc), N'-Di (naphthalene-1-yl)-N,N'-diphenyl-benzidine (NPB), and tris-8-hydroxyquinoline aluminum ($Alq_3$).

When the intermediate layer 220 is a polymer organic material, a hole transport layer (HTL) may be further included in addition to the intermediate layer 220. The hole transport layer (HTL) may be formed of poly-(2,4)-ethylene-dihydroxy thiophene (PEDOT) or polyaniline (PANI). Examples of organic materials that may be used are polyphenylenevinylene (PPV)-based polymer organic materials and polyfluorene-based polymer organic materials. Also, an inorganic material may be further included between the intermediate layer 220 and the pixel electrode 210 and the opposite electrode 230.

The hole transport layer (HTL), the hole injection layer (HIL), the electron transport layer (ETL), and the electron injection (EIL) may be integrally formed over the entire surface of the flexible substrates, and the emission layer (EML) may be formed for each pixel by using an inkjet printing operation. Also, in this case, the hole transport layer (HTL), the hole injection layer (HIL), the electron transport layer (ETL), and the electron injection (EIL) may be disposed within the opening portion of the pixel defining layer 180.

The opposite electrode 230 that covers the intermediate layer 220 including an emission layer and faces the pixel electrode 210 may be disposed over the entire first and second flexible substrates 100-1 and 100-2. The opposite electrode 230 may be formed as a transparent or semi-transparent electrode, or may be formed as a reflective electrode.

When the opposite electrode 230 is formed as a transparent or semi-transparent electrode, the opposite electrode 230 may include a layer formed of a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, and a transparent or semi-transparent conductive layer formed of ITO, IZO, ZnO, $In_2O_3$, or the like. When the opposite electrode 230 is formed as a reflective electrode, it may have a layer formed of Li, Ca, LiF/Ca, LiF/Al, Al, Ag, Mg, or a compound thereof. However, the structure and material of the opposite electrode 230 are not limited thereto, and may be modified in various manners.

Figure 3:
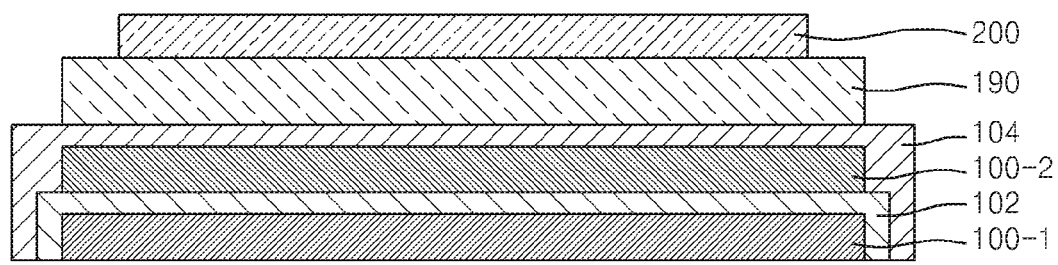
FIG. 3 is a schematic cross-sectional view illustrating a flexible display apparatus according to another embodiment of the present invention.

FIG. 3 is a schematic cross-sectional view illustrating a flexible display apparatus according to another embodiment of the present invention.

Referring to FIG. 3, the flexible display apparatus according to another embodiment of the present invention includes a first flexible substrate 100-1, a first barrier layer 102, a second flexible substrate 100-2, a second barrier layer 104', and an organic light emitting device 200. The structure of the flexible display apparatus according to the current embodiment of the present invention is the same or substantially the same as that described above with reference to FIGS. 1 and 2, except for the second barrier layer 104'. Thus, repetitive description provided above will be omitted.

As illustrated in FIG. 3, the second barrier layer 104' may cover an upper surface and a lateral surface of the second flexible substrate 100-2. At least a portion of the second barrier layer 104' may cover the first barrier layer 102 that covers the lateral surface of the first flexible substrate 100-1. As described above, since at least a portion of the second barrier layer 104' covers the first barrier layer 102 covering the lateral surface of the first flexible substrate 100-1, adhesion between the first flexible substrate 100-1 and the second flexible substrate 100-2, which are formed through carbonization or graphitization, may be further improved.

As described above, according to the flexible display apparatus of the present embodiment of the present invention, the first and second flexible substrates 100-1 and 100-2 are formed by carbonizing or graphitizing a polymer, and thus, the flexible display apparatus of the present embodiment of the present invention provides heat resistance in comparison to substrates according to the existing art which are formed of a plastic material. As a result, manufacturing costs may be reduced by using existing equipment for glass substrates, without the need for additional investment in production equipment. In addition, when a polymer material is carbonized (e.g., graphitized), an adhesive force of an interface between a support substrate and a flexible substrate is reduced, so that the flexible substrate may be detached without laser detaching. In addition, when a substrate including carbon is used, excellent thermal conductivity is provided compared to a substrate formed of a plastic material. Thus, an expensive heat dissipation sheet used in a module process for heat dissipation may be replaced with the substrate including carbon, the manufacturing process may be simplified, and the costs may be reduced.

While the above description is focused on the structural aspects of the flexible display apparatus, the present invention is not limited thereto. For example, a method of manufacturing the flexible display apparatus is also included within the spirit and scope of the present invention.

FIGS. 4 through 11 are schematic cross-sectional views illustrating a method of manufacturing a flexible display apparatus according to another embodiment of the present invention.

Figure 4:
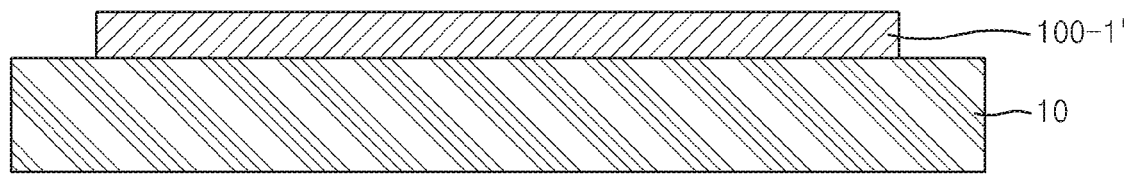
FIGS. 4 through 11 are schematic cross-sectional views illustrating a method of manufacturing a flexible display apparatus according to another embodiment of the present invention.

Referring to FIG. 4, a support substrate 10 may be coated with a first polymer layer 100-1'. The first polymer layer 100-1' may be formed of a plastic material such as PET, PEN, or polyimide, or a polymer material such as PBO, PBI, POD, polytriazole, or PAN.

Figure 5:
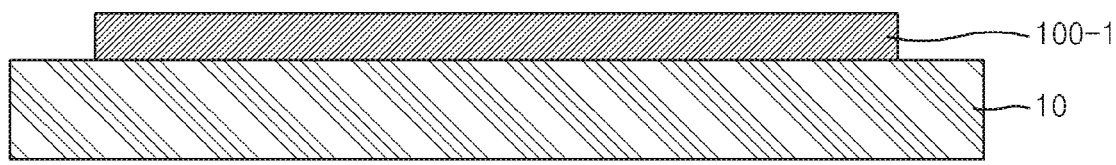

Next, referring to FIG. 5, the first polymer layer 100-1' coated on the support substrate 10 may be carbonized or graphitized. That is, a first flexible substrate 100-1 is formed by carbonizing or graphitizing the first polymer layer 100-1'. A temperature at which the first polymer layer 100-1' is carbonized or graphitized may be from about 300° C. to about 4000° C. When the first polymer layer 100-1' is carbonized at a temperature of 300° C. or lower, the polymer material may not be sufficiently carbonized or graphitized, and when the first polymer layer 100-1' is carbonized or graphitized at a temperature of 4000° C. or higher, the entire polymer material may be carbonized or graphitized. The first polymer layer 100-1' that is carbonized or graphitized as described above may have a ratio of carbon that is greater than or equal to about 60% (e.g., 60% or greater).

As described above, the first flexible substrate 100-1 formed by carbonized or graphitized the first polymer layer 100-1' is flexible, and typically has a planar shape having a predetermined thickness. In other words, the first flexible substrate 100-1 may have an upper surface, a lower surface facing the upper surface, and a lateral surface connecting the upper surface and the lower surface, and may have a thickness of, for example, from about 10 nm to about 500 µm.

Figure 6:
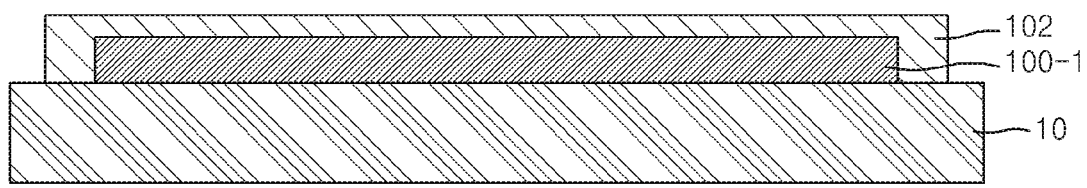

Referring to FIG. 6, a first barrier layer 102 may be formed on the first flexible substrate 100-1 which is formed by carbonizing or graphitizing the first polymer layer 100-1'. The first barrier layer 102 may be formed of an inorganic layer, for example, a silicon oxide and/or a silicon nitride.

As illustrated in FIG. 6, the first barrier layer 102 may be disposed to cover the upper and lateral surfaces of the first flexible substrate 100-1. The first barrier layer 102 may allow the first flexible substrate 100-1, which includes carbon, to remain flexible. Also, the first flexible substrate 100-1, which is formed by carbonizing or graphitizing the first polymer layer 100-1', weakly adheres to the support substrate 10, and in this case, at least a portion of the first barrier layer 102 may be disposed at an outer portion of the flexible substrate 100-1, and may contact the support substrate 10 in order to maintain adhesion between the support substrate 10 and the first flexible substrate 100-1.

Figure 7:
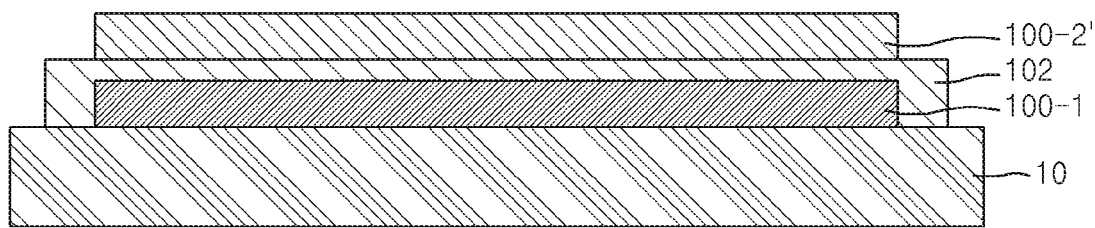

Referring to FIG. 7, the first barrier layer 102 may be coated with a second polymer layer 100-2'. Like the first polymer layer 100-1', the second polymer layer 100-2' may be formed of a plastic material such as PET, PEN, or polyimide, or a polymer material such as PBO, PBI, POD, polytriazole, or PAN.

Figure 8:
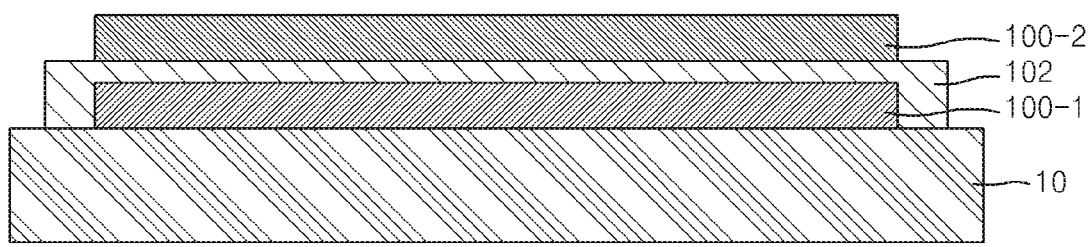

Next, as illustrated in FIG. 8, the second polymer layer 100-2' may be carbonized or graphitized. That is, the second polymer layer 100-2' is carbonized or graphitized to form the second flexible substrate 100-2. In the same or substantially the same manner as the operation of carbonizing or graphitizing the first polymer layer 100-1' described above, the second polymer layer 100-2' may be carbonized or graphitized at a temperature of about 300° C. to about 4000° C. The second polymer layer 100-2' that is carbonized or graphitized as described above may have a ratio of carbon that is greater than or equal to about 60% (e.g., 60% or greater).

As described above, the second polymer layer 100-2' may be carbonized or graphitized to form the second flexible substrate 100-2. The second flexible substrate 100-2 is flexible, and may also have a planar shape having a predetermined thickness. In other words, the second flexible substrate 100-2 may have an upper surface, a lower surface facing the upper surface, and a lateral surface connecting the upper surface and the lower surface, and may have a thickness of, for example, from about 10 nm to about 500 µm.

Figure 9:
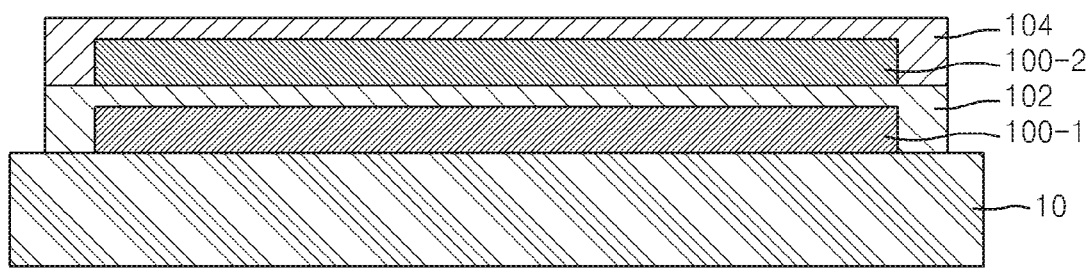

Referring to FIG. 9, a second barrier layer 104 may be formed on the second flexible substrate 100-2. Like the first barrier layer 102, the second barrier layer 104 may be formed of an inorganic layer, for example, a silicon oxide and/or a silicon nitride.

As illustrated in FIG. 9, the second barrier layer 104 may be disposed to cover the upper and lateral surfaces of the second flexible substrate 100-2. The second barrier layer 104 may allow the second flexible substrate 100-2, which includes carbon, to remain flexible. Also, in a manufacturing operation of the flexible display apparatus according to the present embodiment of the present invention, in order for the first flexible substrate 100-1 and the second flexible substrate 100-2 to easily adhere to each other, at least a portion of the second barrier layer 104 may be disposed at an outer portion of the second flexible substrate 100-2, and may contact the first barrier layer 102.

Figure 10:
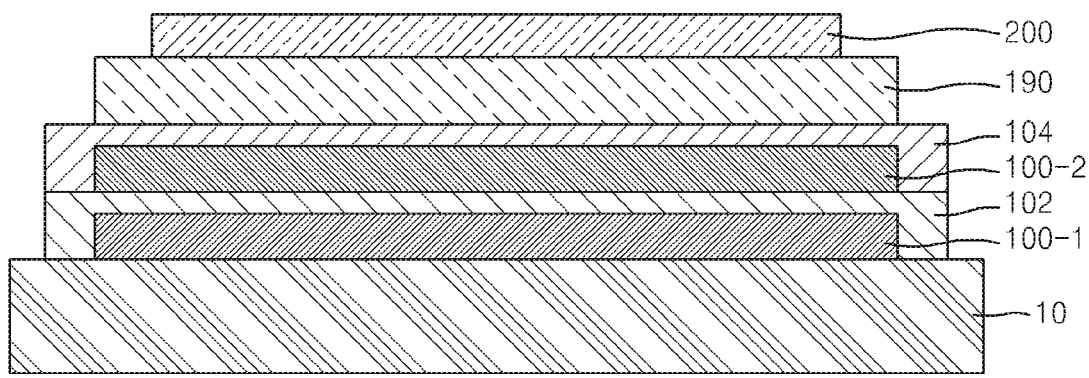

Furthermore, as illustrated in FIG. 10, a TFT layer 190 may be formed on the second barrier layer 104. In addition to a TFT, various elements such as a capacitor or a wiring unit may be disposed in the TFT layer 190. Also, an organic light emitting device 200 may be disposed on the TFT layer 190. The detailed structure of the TFT layer 190 and the organic light emitting device 200 are not illustrated in FIG. 10, and will be described with reference to FIG. 2. In addition, the materials of the TFT layer 190 and the organic light emitting device 200 are the same or substantially the same as described above, and thus, detailed description of the materials will be partly omitted.

Referring to FIG. 2, a buffer layer 110 may be formed of a silicon oxide or a silicon nitride on the second flexible substrate 100-2, in order to planarize a surface of the second flexible substrate 100-2, or to prevent or reduce penetration of impurities into the semiconductor layer 120. Then a semiconductor layer 120 including an amorphous silicon, a polycrystalline silicon, or an organic semiconductor material may be patterned on the buffer layer 110.

In order to insulate the semiconductor layer 120 and the gate electrode 140, a gate insulation layer 130 may be formed on the semiconductor layer 120, and may be formed of a silicon oxide and/or a silicon nitride. Then the gate electrode 140 including an amorphous silicon, a polycrystalline silicon, or an organic semiconductor material may be patterned on the gate insulation layer 130. A source electrode 160' and a drain electrode 160 are electrically operated according to a signal applied to the gate electrode 140.

An interlayer insulation layer 150 may be formed on the gate electrode 140, and may be formed of a silicon oxide or a silicon nitride as a single layer or a multilayer structure.

The source electrode 160' and the drain electrode 160 may be formed on the interlayer insulation layer 150. The source electrode 160' and the drain electrode 160 are electrically connected to the semiconductor layer 120 through contact holes formed in the interlayer insulation layer 150 and the gate insulation layer 130.

A protection layer 170 may be formed on the second flexible substrate 100-2. In this case, the protection layer 170 may also function as a planarization layer.

To protect the TFT having the above-described structure, a planarization layer covering the TFT may be further formed. The planarization layer may be formed of an inorganic material such as a silicon oxide, a silicon nitride, or a silicon oxynitride. The planarization layer may have a single layer or a multilayer structure.

As illustrated in FIG. 2, the gate insulation layer 130, the interlayer insulation layer 150, the planarization layer, and the protection layer 170 may be formed on the first and second flexible substrates 100-1 and 100-2.

The organic light emitting device 200 may be formed on the protection layer 170 or the planarization layer. In the organic light emitting device 200, a pixel electrode 210, an intermediate layer 220 including an emission layer, and an opposite electrode 230 may be sequentially formed.

The pixel electrode 210 may be disposed on the protection layer 170 or the planarization layer. In this case, an opening portion that exposes at least one of the source electrode 160' and the drain electrode 160 of the TFT is formed in the protection layer 170, and the pixel electrode 210 may be electrically connected to the TFT through the opening portion by contacting one of the source electrode 160' and the drain electrode 160 of the TFT.

The pixel electrode 210 may be formed of a transparent or semi-transparent electrode, or may be formed of a reflective electrode. However, the present invention is not limited thereto, and the pixel electrode 210 may be formed of various materials.

The pixel defining layer 180 may be formed on the TFT. The pixel defining layer 180 may be formed on the protection layer 170 described above, and may be patterned so as to form an opening that exposes a center portion of the pixel electrode 210. A pixel area may be defined on a display area of the first and second flexible substrates 100-1 and 100-2 through the opening of the pixel defining layer 180.

The intermediate layer 220 including an emission layer may be disposed in the pixel area defined by the pixel defining layer 180. The intermediate layer 220 of the organic light emitting device 200 includes an emission layer (EML), and may further include a hole injection layer (HIL), a hole transport layer (HTL), an electron transport layer (ETL), and an electron injection layer (EIL) stacked in a single layer or a multilayer structure. However, the intermediate layer 220 is not limited thereto, and may have various structures.

The opposite electrode 230 that covers the intermediate layer 220 and faces the pixel electrode 210 may be disposed over the entire first and second flexible substrates 100-1 and 100-2. The opposite electrode 230 may be formed of a transparent or semi-transparent electrode, or may be formed of a reflective electrode. However, the structure and material of the opposite electrode 230 are not limited thereto, and the opposite electrode 230 may be formed in various manners.

Figure 11:
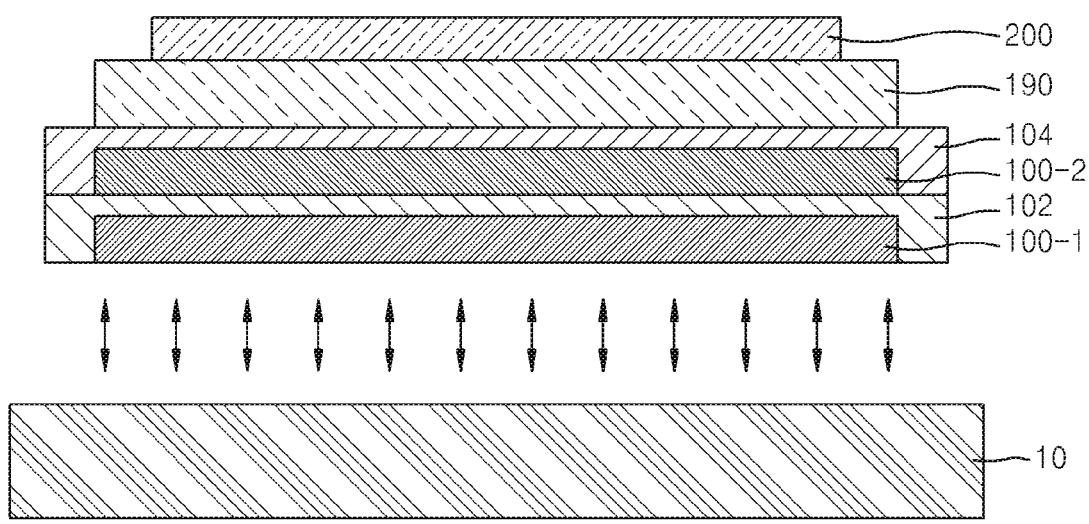

Referring to FIG. 11, the flexible display apparatus according to the present embodiment of the present invention may be detached from a support substrate 10. The first flexible substrate 100-1, which is carbonized at a high temperature, has a low adhesive force at an interface with respect to the support substrate 10, and thus, may be physically detached without laser equipment.

As described above, according to the flexible display apparatus of the present embodiment of the present invention, the first and second flexible substrates 100-1 and 100-2 are formed by carbonizing or graphitizing a polymer, and thus, the flexible display apparatus of the present embodiment of the present invention provides heat resistance when compared to substrates according to the existing art which are formed of a plastic material. As a result, manufacturing costs may be reduced by using existing equipment for glass substrates, without the need for additional investment in production equipment. In addition, as described above, when a polymer material is carbonized or graphitized, an adhesive force of an interface between a support substrate and a flexible substrate is reduced so that the flexible substrate may be detached without laser detaching. Furthermore, when a substrate including carbon is used, as in the present embodiment of the present invention, excellent thermal conductivity is provided compared to a substrate formed of a plastic material, and thus, an expensive heat dissipation sheet used in a module process for heat dissipation may be replaced with the substrate including carbon. Accordingly, the manufacturing process may be simplified and the costs may be reduced.

As described above, according to aspects of embodiments of the present invention, a flexible display apparatus having an improved heat dissipation function and a method of manufacturing the flexible display apparatus are provided. However, the spirit and scope of the present invention are not limited to the aspects described above.

It should be understood that the example embodiments described herein should be considered in a descriptive sense only and not for purposes of limitation. Descriptions of features or aspects within each embodiment should typically be considered as available for other similar features or aspects in other embodiments.

While example embodiments of the present invention have been described with reference to the figures, it will be understood by those of ordinary skill in the art that various changes in form and details may be made therein, without departing from the spirit and scope of the present invention as defined by the following claims, and their equivalents.

What is claimed is:

1. A method of manufacturing a flexible display apparatus, the method comprising:
   coating a support substrate with a first polymer layer;
   carbonizing or graphitizing the first polymer layer;
   forming a first barrier layer on the carbonized or graphitized first polymer layer, the first barrier layer contacting the carbonized or graphitized first polymer layer;
   coating the first barrier layer with a second polymer layer;
   carbonizing or graphitizing the second polymer layer;
   forming a second barrier layer on the carbonized or graphitized second polymer layer; and
   forming an organic light emitting device on the second barrier layer;
   wherein the forming of the second barrier layer comprises forming the second barrier layer to cover the carbonized or graphitized second polymer layer such that at least a portion of the second barrier layer contacts at least a portion of the first barrier layer at an outer portion of the carbonized or graphitized second polymer layer, a portion of the second barrier layer contacts a top surface of the first barrier layer, and a lateral surface of the second barrier layer extends along and contacts an outermost lateral surface of the first barrier layer, the second barrier layer extending beyond the first barrier layer in a plan view,
   wherein the first barrier layer has a single layer structure.

2. The method of claim 1, wherein the forming of the first barrier layer comprises forming the first barrier layer to cover the carbonized or graphitized first polymer layer so that at least a portion of the first barrier layer contacts the support substrate at an outer portion of the carbonized or graphitized first polymer layer.

3. The method of claim 1, wherein the forming of the first barrier layer and the forming of the second barrier layer comprise forming the first barrier layer and the second barrier layer of an inorganic material.

4. The method of claim 1, wherein the carbonizing or graphitizing of the first polymer layer comprises carbonizing or graphitizing the first polymer layer at a temperature from about 300° C. to about 4000° C., and the carbonizing or graphitizing of the second polymer layer comprises carbonizing or graphitizing the second polymer layer at a temperature from about 300° C. to about 4000° C.

5. The method of claim 1, wherein the carbonizing or graphitizing of the first polymer layer comprises carbonizing or graphitizing the first polymer layer such that a ratio of carbon included in the first polymer layer to a material contained in the first polymer layer is greater than or equal to 60%, and the carbonizing or graphitizing of the second polymer layer comprises carbonizing or graphitizing the second polymer layer such that a ratio of carbon included in the second polymer layer to a material contained in the second polymer layer is greater than or equal to 60%.

* * * * *